(12) United States Patent
Toyomura et al.

(10) Patent No.: US 7,649,486 B2
(45) Date of Patent: Jan. 19, 2010

(54) FLASH A/D CONVERTER (75) Inventors: Junji Toyomura, Nagasaki (JP);
Yukitoshi Yamashita, Nagasaki (JP);
Shogo Nakamura, Nagasaki (JP);
Norifumi Kanagawa, Nagasaki (JP);
Yasuhide Shimizu, Nagasaki (JP);
Koichi Ono, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/140,803

(22) Filed: Jun. 17, 2008

(65) Prior Publication Data
US 2009/0015451 A1 Jan. 15, 2009

(30) Foreign Application Priority Data
Jul. 10, 2007 (JP) ............... 2007-180793

(51) Int. Cl.
*H03M 1/36* (2006.01)
(52) U.S. Cl. .............. 341/159; 341/155; 341/156; 341/157; 341/158
(58) Field of Classification Search .......... 341/155–159
See application file for complete search history.

(56) References Cited

U.S. PATENT DOCUMENTS 4,635,036 A * 1/1987 Yoshizawa .......... 341/156

2004/0150544 A1 * 8/2004 Mulder .................. 341/159

FOREIGN PATENT DOCUMENTS

| JP | 10-209869 | 8/1998 |
| JP | 2002-185325 | 6/2002 |
| JP | 2003-218697 | 7/2003 |
| JP | 2004-194138 | 7/2004 |
| JP | 2005-136696 | 5/2005 |

OTHER PUBLICATIONS

Japanese Office Action issued on Apr. 28, 2009 in connection with JP Application No. 2007-180793.

* cited by examiner

*Primary Examiner*—Jean B Jeanglaude
(74) *Attorney, Agent, or Firm*—Sonnenschein Nath & Rosenthal LLP

(57) ABSTRACT

A flash A/D converter includes a reference voltage generator for generating a plurality of reference voltages, a first group of amplifiers having a plurality of amplifiers each of which amplifies a difference voltage between each reference voltage generated by the reference voltage generator and a voltage of an input signal, and a second group of amplifiers having a plurality of amplifiers. Each amplifier of the first group of amplifiers is a differential amplifier having a different pair formed of a plurality of sets of cascade-connected transistors, and has a first switch for short-circuiting respective cascade connection portions of the plurality of transistors configuring the differential pair. Each amplifier of the second group of amplifiers is a differential amplifier having a differential pair formed of at least two transistors and has a second switch for short-circuiting a portion between input units of the differential pair. The first switch and the second switch are controlled to open and close by a control clock of a predetermined period.

5 Claims, 7 Drawing Sheets

FLASH A/D CONVERTER

BACKGROUND OF THE INVENTION

1. Field of the Invention

The present invention relates to a flash A/D (analog-digital) converter for converting an analog signal into digital signal.

2. Description of the Related Art

A flash A/D converter, which is one of the parallel A/D converters, has been widely used. The flash A/D converter divides a predetermined voltage through a plurality of voltage-dividing resistances connected in series to generate a plurality of reference voltages, compares the respective reference voltages with an analog input signal voltage at each comparator, and based on a result obtained by the comparison, outputs digital signal corresponding to the analog input signal.

The flash A/D converter is typically configured by the comparators corresponding to a resolution (in a case of an n-bit A/D converter, for example, $2^n-1$ pieces of comparators) Thus, as the resolution is raised, a circuit size is exponentially increased. Accordingly, power consumption is increased, and a chip size becomes large. In addition, since a large number of comparators ($2^n-1$ pieces of comparators, for example) are connected to the input signal, an input capacitance is increased, and whereby power consumption is increased and a high-speed operation is inhibited as well.

Hence, there is proposed a flash A/D converter which uses an interpolation technology to prevent the increase in circuit size and reduce the input capacitance, and enables a high-speed operation with a low power consumption (see "Description of the Related Art" of Japanese Unexamined Patent Application Publication No. JP 2003-218697, Patent Document 1).

Figure 7:
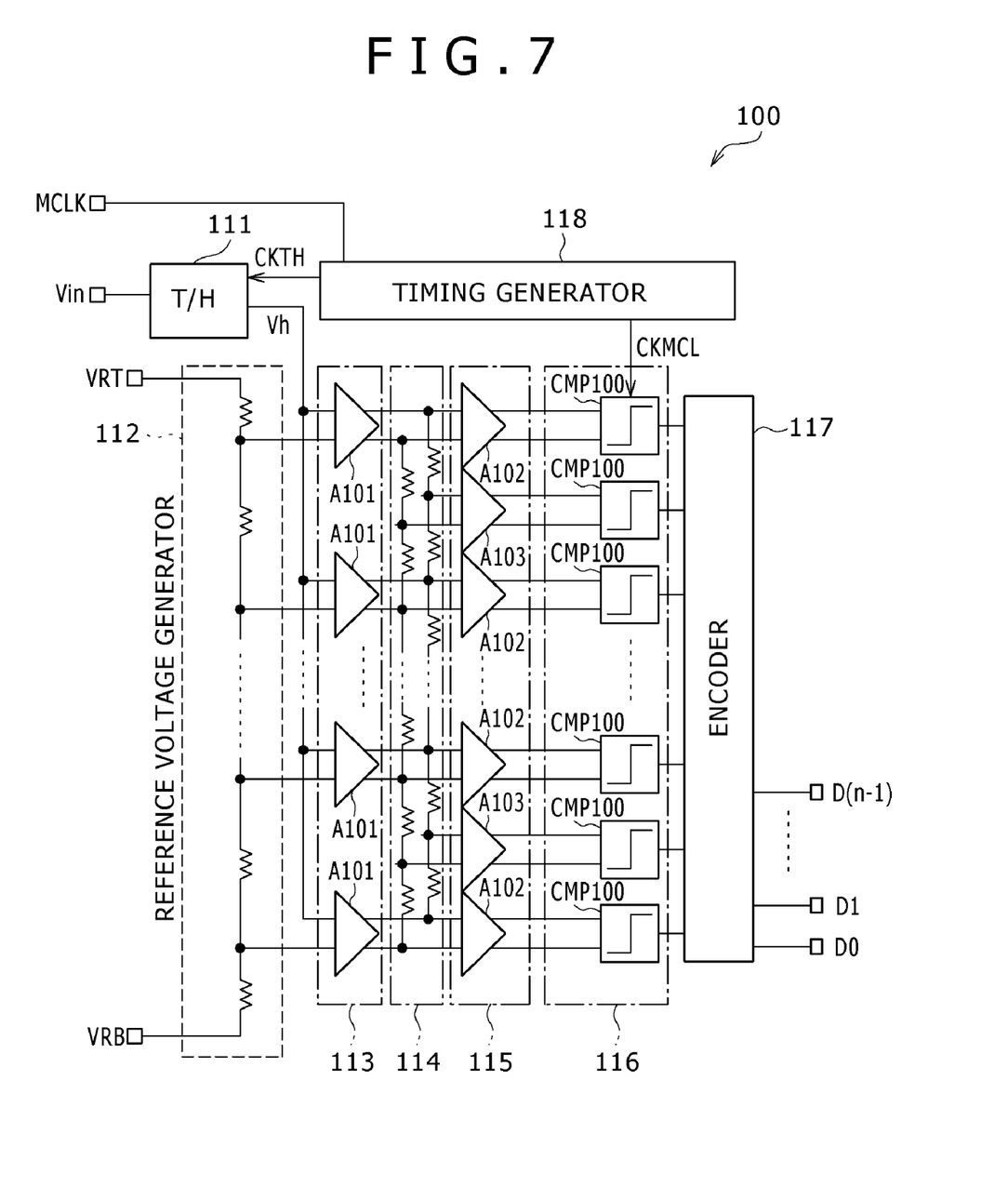
FIG. 7 is a diagram showing a configuration of a flash A/D converter using a related art interpolation technology.

A configuration of the flash A/D converter using the interpolation technology (hereinafter, referred to as an "interpolation flash A/D converter") is shown in FIG. 7. A flash A/D converter 100 includes a sample-hold (T/H) circuit 111, a reference voltage (referred voltage) generation circuit 112, a first group of amplifiers 113, an interpolation circuit 114, a second group of amplifiers 115, a group of comparators 116, an encoder 117, and a timing generator 118.

The sample-hold circuit 111 samples voltage of an analog signal to be inputted (hereinafter, referred to as an "analog input signal"), and holds the sampled value for a certain time period. The reference voltage generation circuit 112 is configured by a plurality of voltage-dividing resistances (hereinafter, referred to as "ladder resistances") connected in series, and generates a plurality of reference voltages having different voltage.

In the first group of amplifiers 113, a difference voltage between each reference voltage generated by the reference voltage generation circuit 112 and the input signal voltage held by the sample-hold circuit 111 is amplified by each of a plurality of amplifiers A101. The second group of amplifiers 115 includes a plurality of amplifiers A103 for amplifying voltage in which a portion between output voltages of the amplifiers A101 whose levels of an inputted reference voltage are adjacent to each other is interpolated by an interpolation circuit 114, in addition to a plurality of amplifiers A102 each of which amplifies an output voltage of each amplifier in the first group of amplifiers 113. The output voltage of each of the amplifiers A102 and A103 is sequentially compared by each comparator CMP 100 of the group of comparators 116. The encoder 117 encodes based on a result of the comparison, and whereby, the digital signal is obtained. The sample-hold circuit 111 and the encoder 117 operate in synchronization with signals CKTH and CKMCL to be outputted from the timing generator 118.

Thus, in the interpolation flash A/D converter, the number of the amplifiers A101 of the first group of amplifiers 113 is reduced to the half thereof while in the second group of amplifiers 115, interpolation voltages are each generated from the output voltages of the two mutually adjacent amplifiers A101 of the first group of amplifiers 113, in order to obtain a comparator output corresponding to a resolution.

Therefore, the number of preamplifiers of the first group of amplifiers 113 may be reduced to the half thereof and an A/D converter capable of performing a high-speed operation with a low electric power consumption may be provided.

SUMMARY OF THE INVENTION

However, in the above-described interpolation flash A/D converter, when an input signal having a low amplitude is inputted after an input signal having a high amplitude is inputted, a property to the input (a low-amplitude input property) is deteriorated. That is, in the above-described interpolation flash A/D converter, the preamplifiers are saturated at the time of high amplitude input, and thus, if low amplitude input is performed from the state, a response is necessarily delayed.

Figure 8:
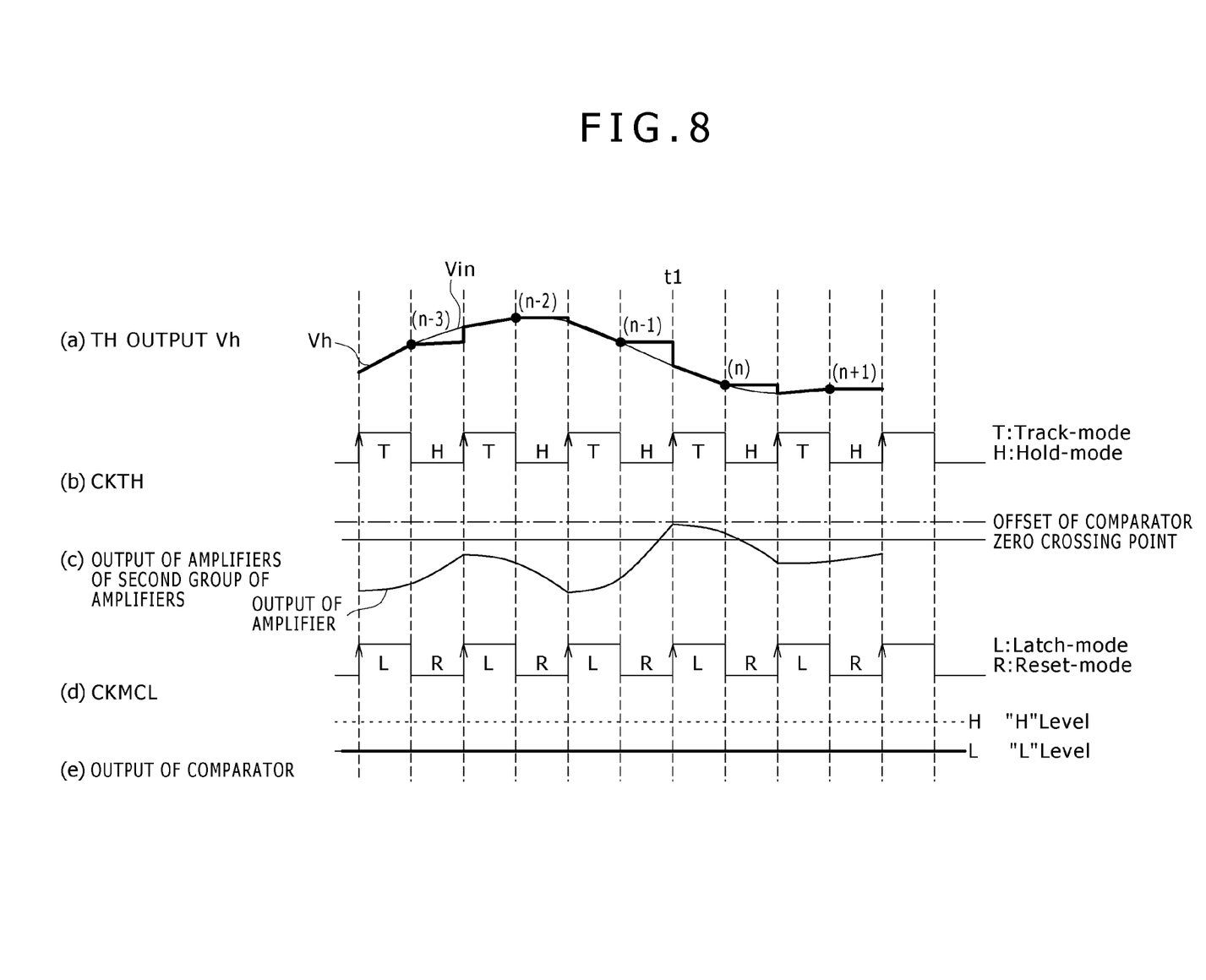
FIG. 8 is a diagram showing an operation overview of the flash A/D converter shown in FIG. 7.

Therefore, if a conversion speed of the A/D converter becomes high, even when an input signal which should be recognized by the comparator as an "H level" is inputted, the response to the low amplitude input is delayed in the amplifiers A101, A102, and A103. Accordingly, the comparator is not able to recognize the "H level" because an offset of the comparator CMP100 cannot be exceeded, as shown in FIG. 8(c). Thus, the comparator CMP100 is caused to recognize erroneously, and an A/D conversion property is deteriorated. A portion (a) in FIG. 8 indicates a signal waveform of an output voltage Vh of the sample-hold circuit 111, (b) indicates a signal waveform of CKTH (a clock for sample hold use) outputted from the timing generator 118, (c) indicates output of the amplifier A102 (or the amplifier A103), (d) indicates a signal waveform of CKMCL (a clock for comparator use) outputted from the timing generator 118, and (e) indicates an output waveform of the comparator CMP100 of the group of comparators 116, respectively.

As described above, in the interpolation flash A/D converter in the related art, the response to the low amplitude input after the input of input signal having a high amplitude is delayed, thereby preventing a high speed in the A/D converter.

Therefore, in embodiments of the present invention, in view of the above-described issues, it is desirable to provide a flash A/D converter in which a response property to a low amplitude input after an input of an input signal having a high amplitude further improved and a higher circuit operation is enabled.

A flash A/D converter according to an embodiment of the present invention includes a reference voltage generator for generating a plurality of reference voltages, a first group of amplifiers having a plurality of amplifiers each of which amplifies a difference voltage between each reference voltage generated by the reference voltage generator and an input signal voltage, and a second group of amplifiers having a plurality of amplifiers each of which amplifies voltage in which a portion between output voltages of the amplifiers whose levels of the reference voltage to be inputted are mutually adjacent is interpolated and a plurality of amplifiers each of which amplifies an output voltage of each amplifier in the first group of amplifiers. Each amplifier of the first group of amplifiers is a differential amplifier having a differential pair formed of a plurality of sets of cascode-connected transistors and has a first switch for short-circuiting respective cascode connection portions of the plurality of transistors forming the differential pair. Each amplifier of the second group of amplifiers is a differential amplifier having a differential pair formed of at least two transistors and has a second switch for short-circuiting a portion between input units of the differential pair, and the first switch and the second switch are controlled to open and close by a control clock of a predetermined period.

The flash A/D converter according to an embodiment of the present invention includes a plurality of resistances for interpolating the output voltage of the second group of amplifiers, and a group of comparators having a plurality of comparators inputted with the voltage interpolated by the plurality of resistances and a plurality of comparators each inputted with a differential output voltage of each amplifier of the second group of amplifiers. The converter is provided with a third switch for short-circuiting a portion between input units in each of the comparators, and the third switch is controlled to open and close by the control clock.

In the flash A/D converter according to an embodiment of the present invention, each of the amplifiers of the second group of amplifiers is a differential amplifier having a differential pair formed of a plurality of sets of cascode-connected transistors and has a fourth switch for short-circuiting the respective cascode connection portions of the plurality of transistors forming the differential pair, and the fourth switch is controlled to open and close by the control clock.

The flash A/D converter according to an embodiment of the present invention, further includes a sample-hold circuit for sampling the input signal voltage, holding the voltage for a certain period, and inputting the held voltage to each amplifier of each of the first group of amplifiers. Each of the switches is controlled by the control clock such that the switch becomes a short-circuit mode during a sample-hold time period of the sample-hold circuit.

The flash A/D converter according to an embodiment of the present invention, the sample-hold circuit is integrated on an identical semiconductor substrate together with the reference voltage generator, the first group of amplifiers, and the second group of amplifiers.

According to the flash A/D converter of embodiments of the present invention, there may be provided a flash A/D converter in which a response property to low amplitude input after high amplitude input is improved to upgrade an A/D conversion speed.

DETAILED DESCRIPTION OF THE EMBODIMENTS

A flash A/D converter in the embodiment includes a reference voltage generator for generating a plurality of reference voltages, a first group of amplifiers having a plurality of first amplifiers each of which amplifies a difference voltage between each reference voltage generated by the reference voltage generator and an input signal voltage, and a second group of amplifiers having a plurality of second amplifiers each of which amplifies voltage obtained by interpolating a portion between output voltages of the first amplifiers whose levels of reference voltages to be inputted are adjacent to each other and having a plurality of third amplifiers each of which amplifies the output voltages of the first amplifiers.

Each first amplifier is a differential amplifier having a differential pair formed of a plurality of sets of cascode-connected transistors, and has a first switch for short-circuiting respective cascode connection portions of the plurality of transistors configuring the differential pair.

Each second amplifier and third amplifier of the second group of amplifiers are a differential amplifier having a differential pair formed of at least two transistors, and have a second switch for short-circuiting a portion between input units of each differential pair.

The first switch and the second switch are controlled to open and close by a control clock of a predetermined period.

As described above, the first switch is controlled to close to perform a reset operation for short-circuiting the respective cascode connection portions of the differential pair in each first amplifier, whereby a response performance to a low amplitude input after a high amplitude input may be improved in the first amplifiers, and, a high-speed operation is enabled. Further, the second switch is controlled to close to short-circuit each portion between input units of the second amplifiers and each portion between input units of the third amplifiers, whereby an influence of the first amplifiers on a reset response, derived from a load resistance of a first amplifier A1 or a parasitic capacitance of an output unit, may be suppressed.

The flash A/D converter in the embodiment includes a plurality of resistances for interpolating portions between output voltages of the respective amplifiers (the second amplifiers and the third amplifiers) in the second group of amplifiers, and further includes a group of comparators having a plurality of comparators inputted with the voltages interpolated by the plurality of resistances and having a plurality of comparators each inputted with differential output voltages of the respective amplifiers of the second group of amplifiers.

In addition, each portion between input units of the respective comparators is provided with a third switch for short-circuiting the portion between the input units. Each third switch is controlled to open and close by a control clock in order to enable suppression of an influence of the second amplifiers and the third amplifiers on a reset response, derived from a load resistance or a parasitic capacitance of output units and enable enhancement of a response performance to the low amplitude input after the high amplitude input in the second amplifiers and the third amplifiers.

Therefore, in the flash A/D converter, a higher-speed operation may be realized, as compared to a case where only the first switch and the second switch are controlled to open and close.

Amplifiers of the second group of amplifiers may be a differential amplifier having a differential pair formed of a plurality of sets of cascode-connected transistors. At this time, a fourth switch for short-circuiting the respective cascode connection portions of the plurality of transistors forming the differential pair may be provided, and the fourth switch may be controlled to open and close by a control clock.

Figure 1:
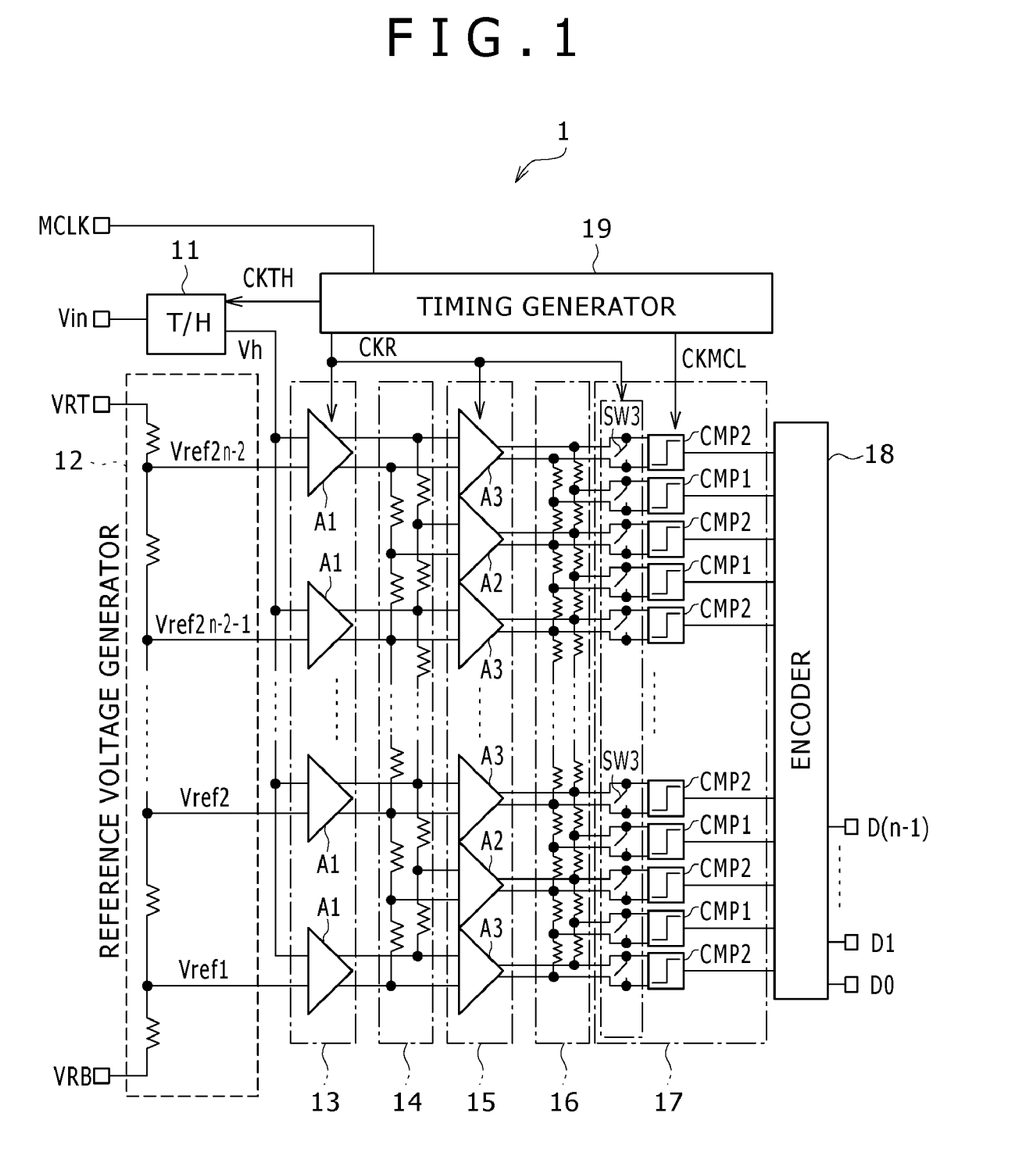
FIG. 1 is a diagram showing a schematic configuration of a flash A/D converter in an embodiment of the present invention.
Figure 2:
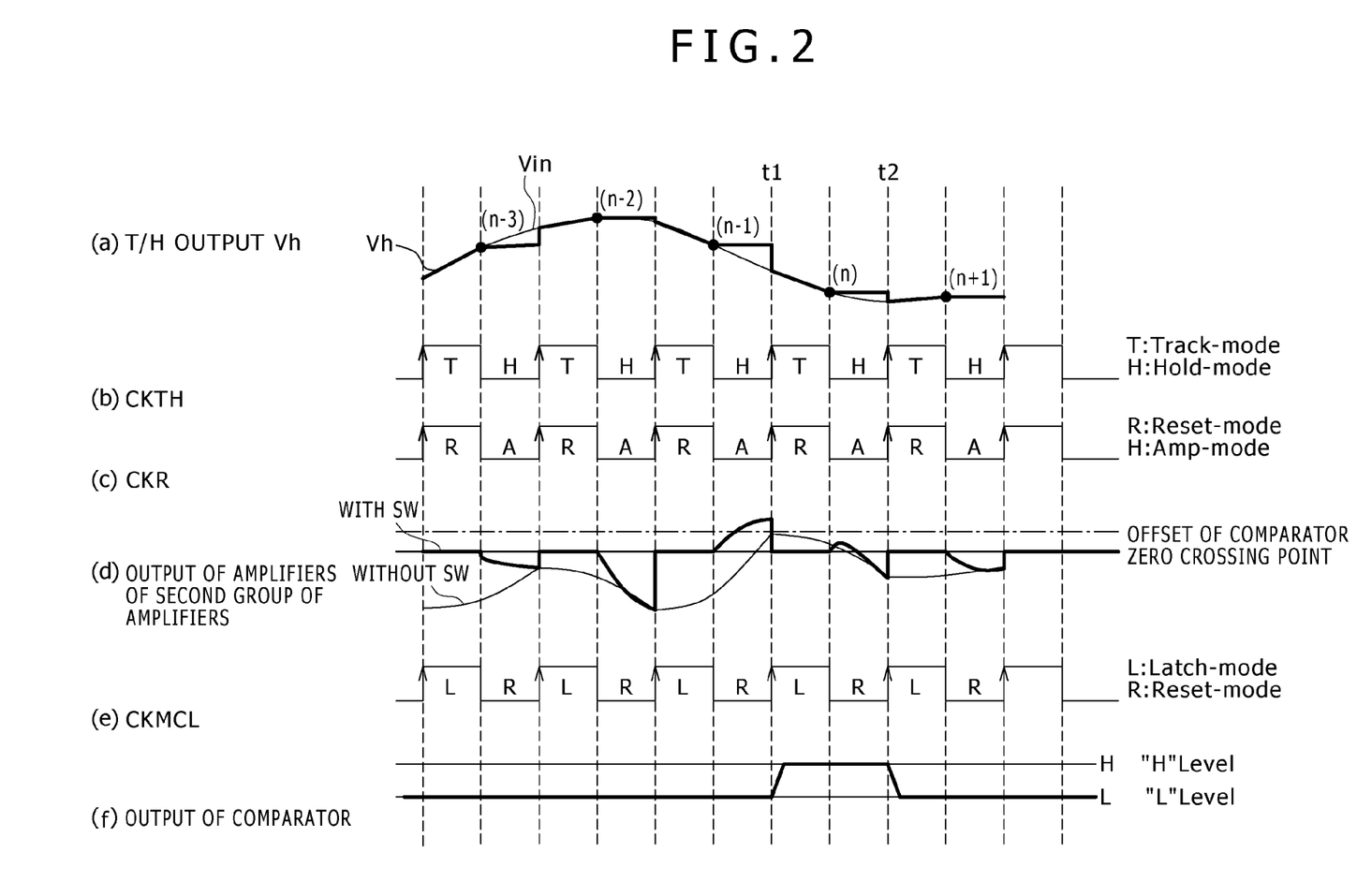
FIG. 2 is a diagram showing an operation overview of the flash A/D converter in an embodiment of the present invention.

With reference to drawings, a flash A/D converter in embodiments of the present invention is described in detail. FIG. 1 is a diagram showing a schematic configuration of the flash A/D converter in an embodiment of the present invention, and FIG. 2 is a diagram showing an operation overview of the flash A/D converter in an embodiment of the present invention.

As shown in FIG. 1, a flash A/D converter 1 in the embodiment is an interpolation flash A/D converter of a resolution of n bits, and includes a sample-hold circuit 11, a reference voltage generating circuit 12, a first group of amplifiers 13, a first interpolation circuit 14, a second group of amplifiers 15, a second interpolation circuit 16, a group of comparators 17, an encoder 18, and a timing generator 19.

The sample-hold (T/H) circuit 11 samples voltage Vin of an analog signal to be inputted (input analog signal) based on a sample-hold control clock CKTH outputted from the timing generator 19, holds the sampled value for a certain time period, and outputs a hold voltage Vh. That is, as shown in (a) and (b) in FIG. 2, when the sample-hold control clock CKTH is at H level, the sample-hold circuit 11 becomes a Track-mode and outputs the analog signal voltage Vin inputted to the sample-hold circuit 11 at its original state. When the sample-hold control clock CKTH is at L level, the sample-hold circuit 11 becomes a Hold-mode, holds a voltage level of the analog signal voltage Vin inputted to the sample-hold circuit 11, and outputs the held voltage (hold voltage) Vh.

The reference voltage generating circuit 12 is configured by a plurality of voltage-dividing resistances (ladder resistances) connected in series, and divides a predetermine voltage (voltage between VRT and VRB) by the voltage-dividing resistances, and generates a plurality of reference voltages Vref (Vref1 to Vref$2^{n-2}$) having different voltage.

The first group of amplifiers 13 is formed of a plurality of first amplifiers A1 whose number ($2^{n-2}$) is one quarter of a number ($2^n$) corresponding to a resolution of n bits of the flash A/D converter 1. A first input end (a comparing input end) of each first amplifier A1 is inputted with the hold voltage Vh of the sample-hold circuit 11, and a second input end (a reference input end) of each first amplifier A1 is inputted with the corresponding reference voltage Vref among the plurality of reference voltages Vref (Vref1 to Vref$2^{n-2}$) generated by the reference voltage generating circuit 112. For each first amplifier A1, a differential amplifier having a differential pair formed of a plurality of sets of cascode-connected transistors is used, as described later. In the differential pair, a first switch SW1, which is described later, for short-circuiting the respective cascode connection portions of the plurality of transistors configuring the differential pair is provided between the cascode connection portions.

The first interpolation circuit 14 has a plurality of resistances for generating an interpolation voltage obtained by interpolating the portion between the output voltages of the first amplifiers A1. That is, in each portion between the output units of the first amplifiers A1 whose levels of the inputted reference voltages Vref are adjacent to each other (hereinafter, briefly referred to as "mutually adjacent"), a first interpolation node connected via each output unit and resistance is provided, and the interpolation voltage obtained by interpolating the output voltages of the mutually adjacent two first amplifiers A1 is outputted from each first interpolation node. Offsets of the first amplifiers A1 are averaged by the first interpolation circuit 14. The output of each first amplifier A1 is a differential output having a positive phase output and an opposite phase output. The interpolation of the portion between the output units of each first amplifier A1 is performed between the respective positive phase outputs and between the respective opposite phase outputs. Therefore, the interpolation voltage generated by the first interpolation circuit 14 is a differential interpolation voltage which includes a positive-phase interpolation voltage of the positive phase output of the first amplifier A1 and an opposite-phase interpolation voltage of the opposite phase output of the first amplifier A1.

The second group of amplifiers 15 includes a plurality of second amplifiers A2 for amplifying the differential interpolation voltage outputted from each interpolation node of the first interpolation circuit 14 and a plurality of third amplifiers A3 each of which amplifies the differential output voltage of each first amplifier A1. The second amplifiers A2 and the third amplifiers A3 are each differential amplifiers having a differential pair formed of at least two transistors. As described later, a second switch SW2 for short-circuiting a portion between input units (between a positive-phase input end and an opposite-phase input end) of the differential pair is provided between the input units of the differential pair.

The second interpolation circuit 16 includes a plurality of resistances for generating interpolation voltages each of which interpolates the output voltage of second amplifier A2 and the output voltage of third amplifier A3. That is, in each portion between the output units of the mutually adjacent second amplifiers A2 and the third amplifiers A3, a second interpolation node connected via these output units and the resistances is provided. The interpolation voltage which interpolates the output voltages of the mutually adjacent second amplifiers A2 and the third amplifiers A3 are outputted from each second interpolation node. The outputs of the second amplifiers A2 and the third amplifiers A3 are differential outputs having a positive phase output and an opposite phase output. The interpolation of the portion between the output units of the second amplifiers A2 and the third amplifiers A3 is performed between the positive phase outputs and between the opposite phase outputs. Therefore, the interpolation voltage generated by the second interpolation circuit 16 is a differential interpolation voltage which includes a positive-phase interpolation voltage of the positive phase outputs of the second amplifiers A2 and the third amplifiers A3 and an opposite-phase interpolation voltage of the opposite phase outputs of the second amplifiers A2 and the third amplifiers A3.

The group of comparators 17 has a plurality of comparators CMP1 inputted with the differential interpolation voltage outputted from each interpolation node of the second interpolation circuit 16 and a plurality of comparators CMP2 inputted with each of the differential output voltage of the second amplifier A2 and the third amplifier A3. The encoder 18 serves to output digital signals D(0) to D(n−1) corresponding to the hold voltage Vh in which the input signal voltage Vin is held based on a result of comparisons of the comparators CMP1 and CMP2. Each of the comparators CMP1 and CMP2 latches and outputs the result of comparisons at a rising edge of a latch control clock CKMCL outputted from the timing generator 19 (see FIG. 2). In each of the comparators CMP1 and CMP2, there is provided a third switch SW3 for short-circuiting a portion between differential input units in each of the comparators CMP1 and CMP2 (a portion between a positive-phase input end and an opposite-phase input end) in a portion between the differential input units.

The encoder 18 encodes based on the result of comparisons by each of the comparators CMP1 and CMP2 of the group of comparators 17 and outputs the digital signals D(0) to D(n−1). The timing generator 19 is inputted with a master clock MCLK and outputs the control clocks CKTH, CKR, and CKMCL of a predetermined period.

In the flash A/D converter 1 having the above-described configuration, each of the switches SW1, SW2, and SW3 repeats opening and closing operations by a control clock generated by the timing generator 19, which is the reset control clock CKR synchronizing with the sample-hold control clock CKTH and the latch control clock CKMCL. That is, when the sample-hold circuit 11 is at the Track-mode, voltage of the reset control clock CKR becomes an H level such that a short-circuit mode (a reset mode) in which each of the switches SW1, SW2, and SW3 is short-circuited (closed operation) is attained, and when the sample-hold circuit 11 is at the Hold-mode, the voltage of the reset control clock CKR becomes L level such that an open mode (amplifier mode) in which each of the switches SW1, SW2, and SW3 is opened (opened operation) is attained.

The voltage in the portion between the input units (a portion between the positive-phase input end and the opposite-phase input end) in second amplifier A2 (or third amplifier A3) of the second group of amplifiers 15 becomes 0V (zero crossing point) when the sample-hold circuit 11 is at the Track-mode, on the other hand, when the sample-hold circuit 11 starts the Hold-mode, the voltage changes from a zero crossing point state by following the hold voltage Vh (see a waveform of "with SW" shown in (d) in FIG. 2, for example).

Therefore, even when there is the offset in second amplifier A2 (or third amplifier A3), the voltage in the portion between the output units in second amplifier A2 (or third amplifier A3) changes from the zero crossing point by following the hold voltage Vh, when the sample-hold circuit 11 starts the Hold-mode. Thus, a response property to the low amplitude input after the high amplitude input may be improved, as compared to a case where the switches SW1, SW2, and SW3 are not available.

That is, when neither of the switches SW1, SW2, and SW3 is present, the response to the low amplitude input after the high amplitude input exhibits a property indicated by a waveform of "without SW" in (d) in FIG. 2 when the input signal voltage Vin is at a state indicated in (a) in FIG. 2, for example. As a result, it becomes difficult to exceed the offset at a timing t1, and thus, the output of comparator CMP2 (or comparator CMP1) becomes L level. On the other hand, in the flash A/D converter 1 in the embodiment, each of the switches SW1, SW2, and SW3 is provided and the opening and closing are controlled, whereby, the response exhibits a property indicated by the waveform of "with SW" in (d) in FIG. 2 when the input signal voltage Vin is at a state indicated in (a) in FIG. 2, for example. As a result, it may become possible to exceed the offset at the timing t1, and thus, the output of each comparator CMP2 (or comparator CMP1) may be H level.

A circuit configuration of the flash A/D converter 1 in the embodiment is described more specifically below.

Figure 3A:
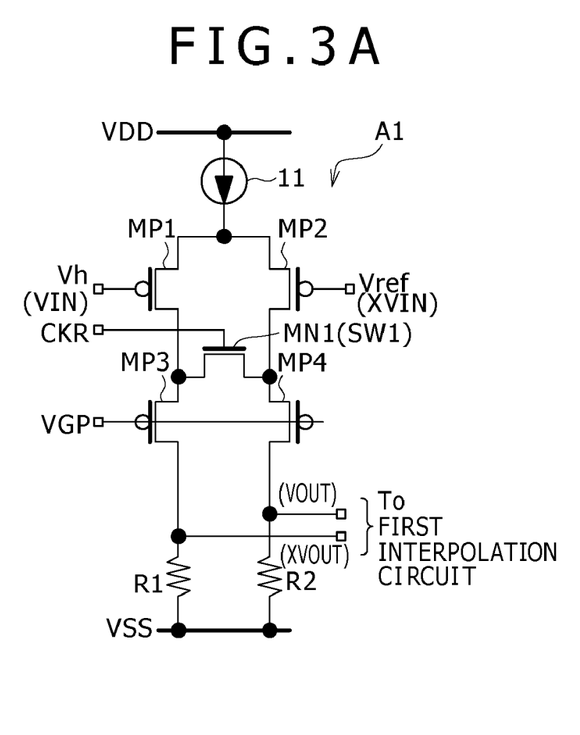
FIG. 3A is a diagram showing a circuit configuration of a first amplifier A1 in the embodiment.
Figure 3B:
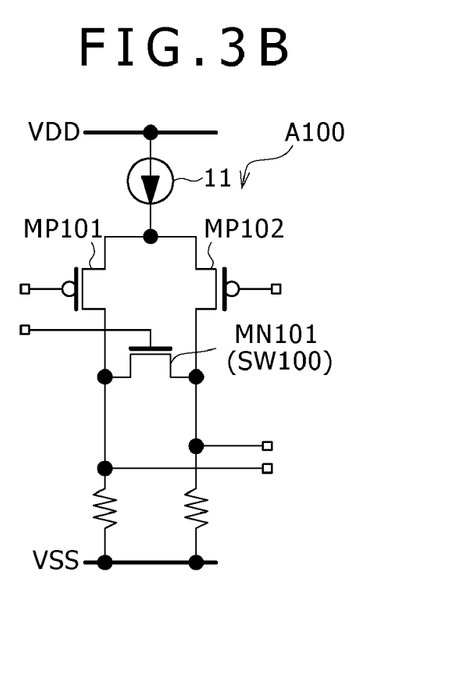
FIG. 3B is a diagram showing a circuit configuration of a related art amplifier.

Firstly, with reference to the drawings, a specific description is made of one example of a circuit configuration of first amplifier A1 of the first group of amplifiers 13. FIG. 3A is a diagram showing the circuit configuration of first amplifier A1 in the embodiment, and FIG. 3B is a diagram showing a circuit configuration of a related-art amplifier corresponding to the first amplifier A1.

As shown in FIG. 3A, first amplifier A1 is a differential amplifier having a differential pair formed of a set of a plurality of cascode-connected PMOS transistors MP1 and MP3 and a set of a plurality of similarly cascode-connected PMOS transistors MP2 and MP4.

A source of the PMOS transistor MP1 configuring one side of the differential pair is connected via a constant current source I1 to a power supply potential VDD, and a drain thereof is connected to a source of the PMOS transistor MP3. A drain of the PMOS transistor MP3 is connected to a reference potential VSS via a load resistance R1.

A source of the PMOS transistor MP2 configuring the other side of the differential pair is connected via the constant current source I1 to the power supply potential VDD, and a drain thereof is connected to a source of the PMOS transistor MP4. A drain of the PMOS transistor MP4 is connected via a load resistance R2 to the reference potential VSS. Respective gates of the PMOS transistors MP3 and MP4 are inputted with a predetermine bias voltage VGP.

A gate of the PMOS transistor MP1, as a first input end (a positive phase input VIN) of first amplifier A1, is inputted with the hold voltage Vh outputted from the sample-hold circuit 11. A gate of the PMOS transistor MP2, as a second input end (an opposite phase input XVIN) of first amplifier A1, is inputted with the corresponding reference voltage Vref. First amplifier A1 amplifies a difference voltage between the hold voltage Vh inputted to the first input end and the reference voltage Vref inputted to the second input end, and outputs the voltage amplified from the drain (an opposite phase output end) of the PMOS transistor MP3 and the drain (an opposite phase output end) of the PMOS transistor MP4, both being a differential output end, to the first interpolation circuit 14.

Between a cascode connection portion, which is a connecting point between the PMOS transistors MP1 and MP3, and a cascode connection portion, which is a connecting point between the PMOS transistors MP2 and MP4, an NMOS transistor MN1, which serves as the first switch SW1 for short-circuiting the respective cascode-connected sections, is connected.

The first switch SW1 becomes a short-circuit mode to reset the first amplifiers A1 when the sample-hold circuit 11 is at the tracking mode and becomes the release mode to releases the reset of the first amplifier A1 to cause to perform amplification operation when the sample-hold circuit 11 is at the Hold-mode, whereby the first amplifier A1 is operated in high speed.

As shown in FIG. 3B, in the related-art amplifier A100 which corresponds to first amplifier A1, a switch SW100 (NMOS transistor MN101) corresponding to the first switch SW1 is arranged in the portion between the differential output ends in the amplifier A100 so that a high-speed operation is enabled. However, it is necessary to increase a chip size of the transistors (PMOS transistors MP101 and MP102) of the differential pair when the high speed and high accuracy are implemented in the amplifier A100, and whereby, an output capacitance becomes large. Further, when a gain of the amplifier A100 is increased, an input capacitance is also increased by a mirror effect.

To solve such an issue, in first amplifier A1 in the embodiment, the PMOS transistors MP3 and MP4, which are cascode transistors, are added, and the NMOS transistor MN1, which is the first switch SW1, is arranged between the cascode connection portions (the source of the PMOS transistor MP1 and the source of the PMOS transistor MP2). Accordingly, the high-speed operation is enabled without increasing the output capacitance.

Figure 4:
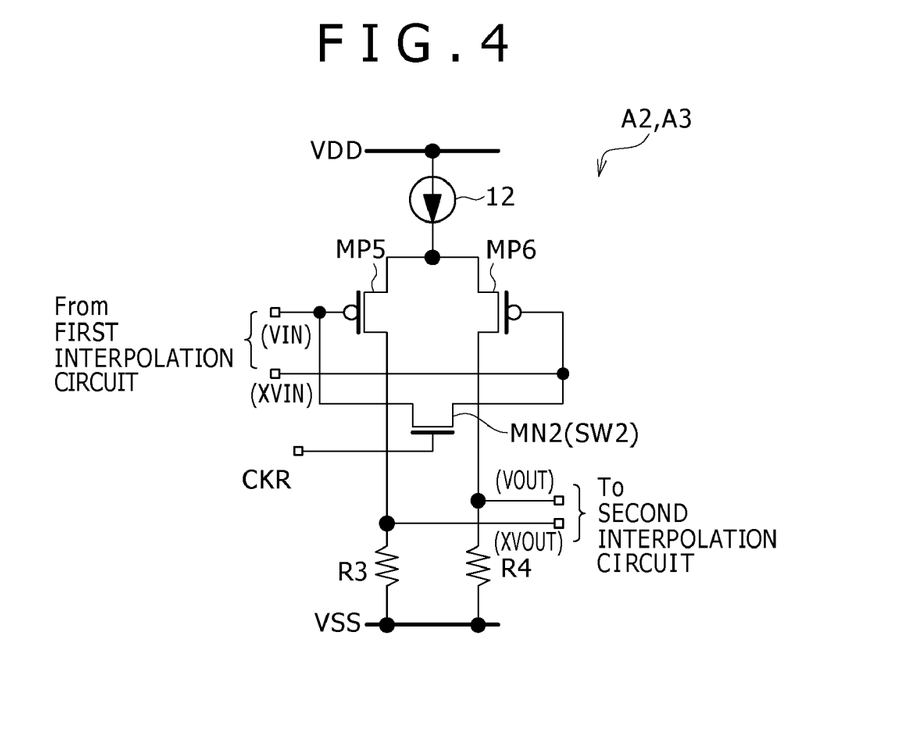
FIG. 4 is a diagram showing a circuit configuration of a second amplifier and a third amplifier in the embodiment.

Subsequently, with reference to a drawing, a specific description is given of one example of a circuit configuration of second amplifier A2 and third amplifier A3 of the second group of amplifiers 15. FIG. 4 is a diagram showing the circuit configuration of the second amplifier A2 and the third amplifier A3 in the embodiment. The second amplifier A2 and the third amplifier A3 are differential amplifiers having the same configuration.

As shown in FIG. 4, the second amplifier A2 and the third amplifier A3 are differential amplifiers having a differential pair formed of a plurality of cascode-connected PMOS transistors MP5 and MP6.

A source of the PMOS transistors MP5 configuring one side of differential pair is connected via a constant current source I2 to the power supply potential VDD, and a drain thereof is connected via a load resistance R3 to the reference potential VSS. A source of the PMOS transistors MP6 configuring the other side of the differential pair is connected via the constant current source I2 to the power supply potential VDD, and a drain thereof is connected via a load resistance R4 to the reference potential VSS.

A differential input end in which a gate of the PMOS transistors MP5 serves as a first input end (a positive phase input VIN) and a gate of the PMOS transistor MP6 serves as a second input end (an opposite phase input XVIN) is inputted with a differential voltage (the differential output voltage of the first amplifier A1 or the differential interpolation voltage of the interpolation node) outputted from the first interpolation circuit 14. The difference voltages are amplified, and the differential voltage amplified from a drain (an opposite phase output XVOUT) of the PMOS transistor MP5 and a drain (a positive phase output VOUT) of the PMOS transistor MP6, both being differential output ends is outputted to the second interpolation circuit 16.

An output response of the first amplifier A1 by the above-described first switch SW1 is a response at a time constant of the load resistances R1 and R2 of the first amplifier A1 and the parasitic capacitance generated at the differential output ends. When this response is not high speed, the mode is switched to the amplifier mode while the input units of the second amplifier A2 and the third amplifier A3, which are amplifiers at a subsequent stage, are not yet completely reset. As a result, output waveforms of the second amplifier A2 and the third amplifier A3 do not so greatly differ from that in the related-art waveform (the waveform of "without SW" indicated in (d) in FIG. 2), and thus, it is difficult to achieve the high speed operation. It is conceivable to reduce the time constant by making the load resistances R1 and R2 small. However, the load resistances R1 and R2 are also parameters of a gain (=gm×R) of the first amplifier A1, and thus, when the accuracy of the A/D conversion is taken into consideration, there is a limit in decreasing resistances. It is noted that gm denotes a transconductance of a MOS transistor.

Therefore, the portion between the input units in the second amplifier A2 and the third amplifier A3 (between the gate of the PMOS transistors MP5 and the gate of the PMOS transistors MP6) is connected with NMOS transistor MN2 as the second switch SW2 for short-circuiting the portion between the input units. When the sample-hold circuit 11 is at the tracking mode, the second switch SW2, as similar with a case of the first switch SW1, short-circuits the portion between the input units in the second amplifier A2 and the third amplifier A3 in order to reset, and when the sample-hold circuit 11 is at the Hold-mode, the second switch SW2 cancels the resetting of the portion between the input units in the second amplifier A2 and the third amplifier A3 to cause to perform an amplification operation. Accordingly, it may become possible to ensure the resetting operation to the input response of the second amplifier A2 and the third amplifier A3, and thus, a higher-speed operation may be realized.

As described above, the offsets of the first amplifiers A1 are averaged by the first interpolation circuit 14, therefore, the second amplifiers A2 and the third amplifiers A3 can make an input-referred offset small. Since the input transistor (the PMOS transistors MP5 and MP6) is not required to be made large, the cascode transistor is not required to be provided in many cases. However, the cascode transistor may be provided in the second amplifiers A2 and the third amplifiers A3. In this case, it is desirable that a fourth switch SW4 is provided in the portion between cascode connections.

Figure 5:
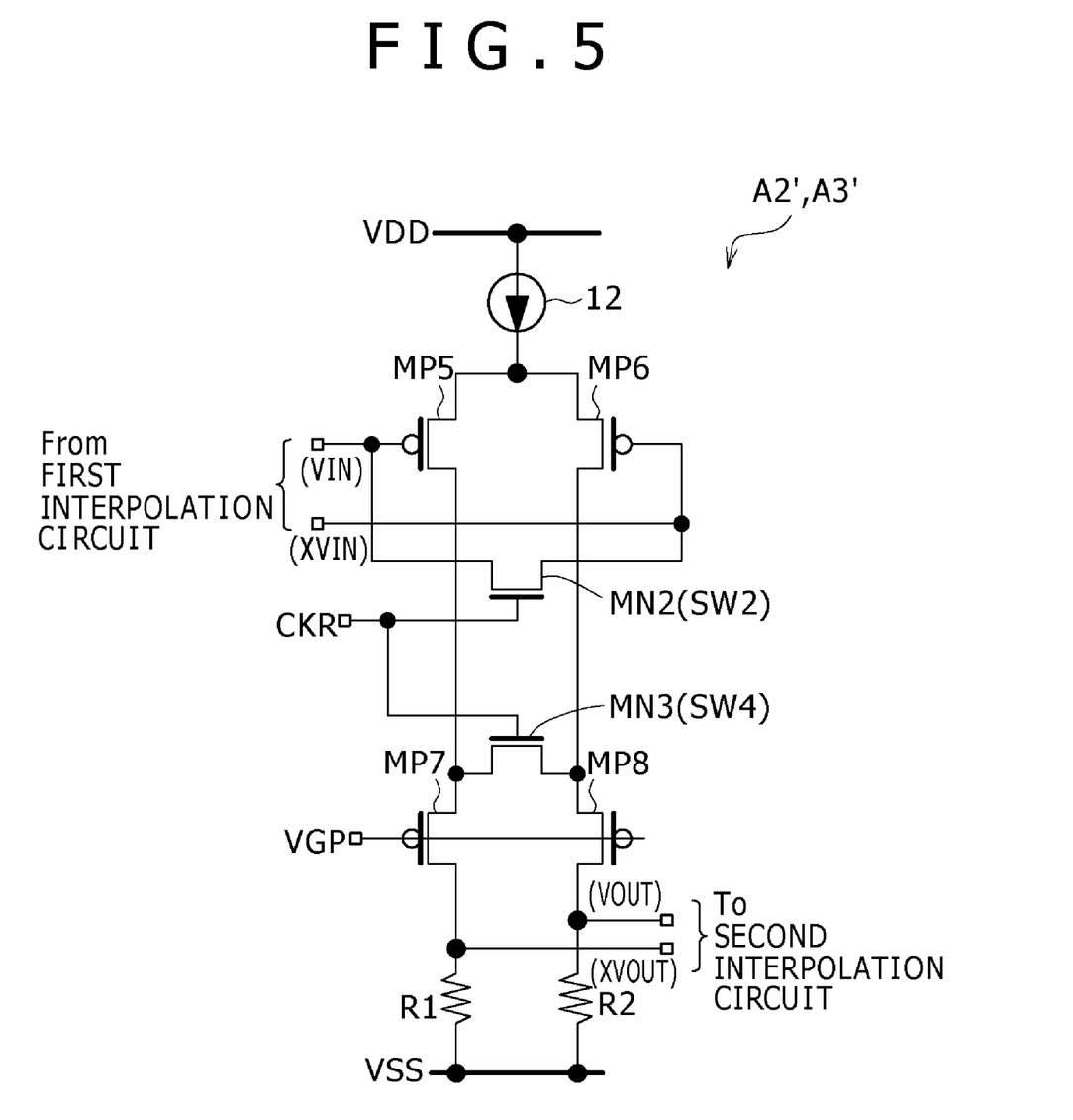
FIG. 5 is a diagram showing another circuit configuration of the second amplifier and the third amplifier.

For example, FIG. 5 shows a configuration of a second amplifier A2' and a third amplifier A3' (the second amplifier A2' and the third amplifier A3' have the same configuration) having a differential amplifier having a differential pair formed of a plurality of sets of cascode-connected transistors, and the PMOS transistors MP5 and MP6 are provided as the cascode transistor. NMOS transistor MN3 as the fourth switch SW4 for short-circuiting the cascode connections of the plurality of transistors configuring this differential pair is connected to the drain of the PMOS transistors MP5 and a drain of the PMOS transistors MP6, respectively.

As described above, the flash A/D converter 1 in the embodiment controls the first switch SW1 for short-circuiting the respective cascode connections of the differential pair of the first amplifier A1, the second switch SW2 for short-circuiting the portion between the input units in the second amplifier A2 and the third amplifier A3, and the third switch SW3 for short-circuiting the portion between the input units in the comparators CMP1 and CMP2 to open and close by the reset control clock CKR such that each switch is short-circuited when the sample-hold circuit 11 is at the Track-mode and is released when the sample-hold circuit 11 is at the amplifier mode. Accordingly, the low amplitude input property after input of the input signal having a high amplitude is further improved to enable a higher-speed circuit operation.

In the interpolation flash A/D converter according to the embodiment, when the present invention is applied to an interpolation flash A/D converter having a configuration in which the sample-hold circuit 11 is integrated on the same substrate (chip) with the reference voltage generating circuit 12, the first group of amplifiers 13, the first interpolation circuit 14, the second group of amplifiers 15, the second interpolation circuit 16, the group of comparators 17, and the encoder 18, it may become possible to use a circuit configuration having a low drive capability at an output stage of the sample-hold circuit 11. Thus, there is an advantage in that an electric power consumption at the sample-hold circuit 11 may be reduced.

Figure 6:
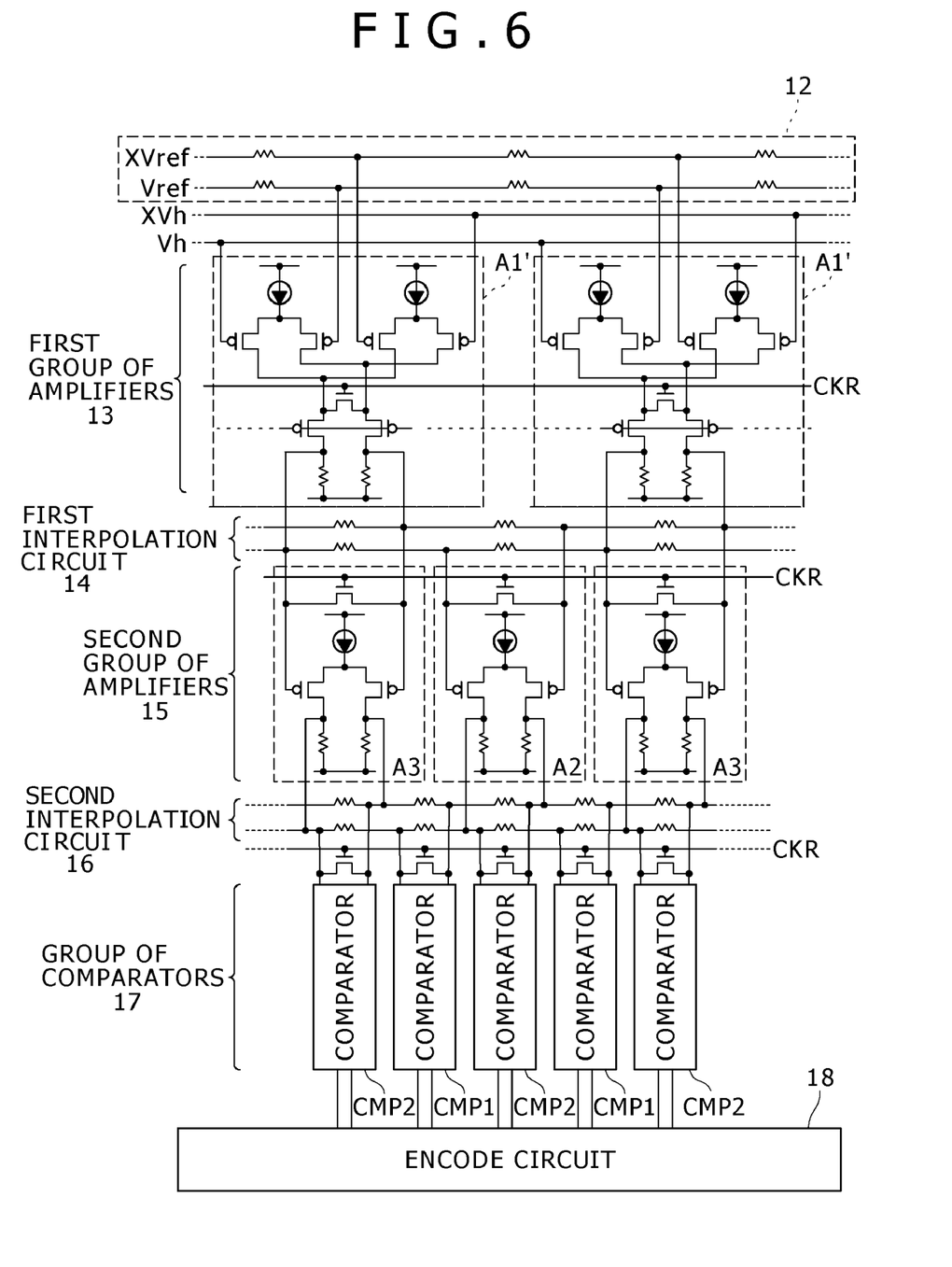
FIG. 6 is a diagram showing a configuration of a flash A/D converter of a fully differential signal.

In the above-described embodiment, in first amplifier A1, the input end thereof is inputted with the hold voltage Vh and the reference voltage Vref and the difference voltage therebetween is amplified. However, by using first amplifiers A1' as shown in FIG. 6 instead of the first amplifiers A1, it is possible to configure a flash A/D converter in which all of the respective amplifiers operate by the differential signal. That is, as shown in FIG. 6, input ends of each first amplifier A1' may be inputted with a positive phase voltage Vh and an opposite phase voltage XVh of the hold voltage Vh, and a positive phase voltage Vref and an opposite phase voltage XVref of the reference voltage Vref, respectively. The differential output may be performed, based on the difference voltage between the positive phase voltage Vh of the hold voltage and the positive phase voltage Vref of the reference voltage and the difference voltage between the opposite phase voltage XVh of the hold voltage and the opposite phase voltage XVref of the reference voltage. It is noted that configurations of the second amplifiers A2, the third amplifiers A3, and the like are the same as configuration already described above.

As described above, although several embodiments of the present invention are described in detail with reference to the drawings, these are exemplary. Based on the knowledge of a person skilled in the art, the present invention may be implemented in other various modified and improved modes.

It should be understood by those skilled in the art that various modifications, combinations, sub-combinations and alterations may occur depending on design requirements and other factors insofar as they are within the scope of the appended claims or the equivalents thereof.

The present document contains subject matter related to Japanese Patent Application No. 2007-180793 filed in the Japanese Patent Office on Jul. 10, 2007, the entire content of which being incorporated herein by reference.

What is claimed is:

1. A flash A/D converter comprising:
   a reference voltage generator for generating a plurality of reference voltages;
   a first group of amplifiers having a plurality of amplifiers each of which amplifies a difference voltage between each reference voltage generated by the reference voltage generator and a voltage of an input signal; and
   a second group of amplifiers having a plurality of amplifiers each of which amplifies voltage obtained by interpolating a portion between output voltages of the amplifiers whose levels of the reference voltage to be inputted are mutually adjacent and a plurality of amplifiers each of which amplifies an output voltage of each amplifier in the first group of amplifiers, wherein,
   each amplifier of the first group of amplifiers is a differential amplifier having a differential pair formed of a plurality of sets of cascode-connected transistors, and has a first switch for short-circuiting respective cascode connection portions of the plurality of transistors configuring the differential pair;
   each amplifier of the second group of amplifiers is a differential amplifier having a differential pair formed of at least two transistors and has a second switch for short-circuiting a portion between input units of the differential pair; and
   the first switch and the second switch are controlled to open and close by a control clock of a predetermined period.

2. The flash A/D converter according to claim 1, further comprising:
   a plurality of resistances for interpolating output voltage of the second group of amplifiers; and
   a group of comparators having a plurality of comparators inputted with the voltage interpolated by the plurality of resistances and a plurality of comparators each inputted with a differential output voltage of each amplifier of the second group of amplifiers, wherein;
   a third switch for short-circuiting a portion between input units in each of the comparators is provided; and
   the third switch is controlled to open and close by the control clock.

3. The flash A/D converter according to claim 1 or 2, wherein,
   the amplifiers of the second group of amplifiers are differential amplifiers having differential pairs formed of a plurality of sets of cascode-connected transistors and has a fourth switch for short-circuiting the respective cascode connection portions of the plurality of transistors configuring the differential pair; and
   the fourth switch is controlled to open and close by the control clock.

4. The flash A/D converter according to claim 1, further comprising:
   a sample-hold circuit for sampling a voltage of the input signal, holding for a certain time period, and inputting the held voltage to each amplifier of each of the first group of amplifiers, wherein,
   each of the switches is controlled by the control clock such that a short-circuit mode is attained in a sample-hold time period of the sample-hold circuit.

5. The flash A/D converter according to claim 4, wherein, the sample-hold circuit is integrated on an identical semiconductor substrate together with the reference voltage generator, the first group of amplifiers, and the second group of amplifiers.

* * * * *